US012751169B2

(12) United States Patent
Park et al.

(10) Patent No.: US 12,751,169 B2
(45) Date of Patent: Sep. 29, 2026

(54) DISPLAY DEVICE HAVING A FIRST LAYER AND A SIGNAL WIRE HAVING DIFFERENT THICKNESSES

(71) Applicant: Samsung Display Co., Ltd., Yongin-Si (KR)

(72) Inventors: Kyung Hoon Park, Suwon-si (KR); Jae Seol Cho, Seoul (KR); Seungjoo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 714 days.

(21) Appl. No.: 17/889,637

(22) Filed: Aug. 17, 2022

(65) Prior Publication Data

US 2023/0225168 A1 Jul. 13, 2023

(30) Foreign Application Priority Data

Jan. 13, 2022 (KR) ........................ 10-2022-0005287

(51) Int. Cl.

*H10K 71/00* (2023.01)
*H10K 59/12* (2023.01)
*H10K 59/123* (2023.01)
*H10K 59/131* (2023.01)

(52) U.S. Cl.

CPC ....... *H10K 59/1315* (2023.02); *H10K 59/123* (2023.02); *H10K 71/00* (2023.02); *H10K 59/1201* (2023.02)

(58) Field of Classification Search

None

See application file for complete search history.

(56) References Cited

U.S. PATENT DOCUMENTS 9,704,934 B2 7/2017 Park
2018/0069128 A1* 3/2018 Shin .................. G02F 1/136209
2021/0202670 A1* 7/2021 Koh .................... H10K 59/1315
2023/0094885 A1* 3/2023 Yu ........................ H10D 86/421 257/40

FOREIGN PATENT DOCUMENTS

KR 10-2019-0061823 A 6/2019
KR 10-2020-0088940 A 7/2020
KR 10-2021-0086898 A 7/2021

* cited by examiner

*Primary Examiner* — Sue A Purvis
*Assistant Examiner* — Seyon Ali-Simah Punchbeddell
(74) *Attorney, Agent, or Firm* — Innovation Counsel LLP

(57) ABSTRACT

A display device according to an embodiment includes: a substrate including a signal wire area and a transistor area; a first layer disposed in the transistor area; a signal wire disposed in the signal wire area; a transistor disposed on the first layer; a first electrode electrically connected to the transistor; and an emission layer and a second electrode disposed on the first electrode, wherein the first layer and the signal wire are disposed on a same layer on the substrate, and the first layer and the signal wire have different thicknesses.

12 Claims, 15 Drawing Sheets

DISPLAY DEVICE HAVING A FIRST LAYER AND A SIGNAL WIRE HAVING DIFFERENT THICKNESSES

CROSS-REFERENCE TO RELATED APPLICATION

This application claims priority to and the benefit of Korean Patent Application No. 10-2022-0005287 filed in the Korean Intellectual Property Office on Jan. 13, 2022, the entire contents of which are incorporated herein by reference.

BACKGROUND

(a) Field

The present disclosure relates to a display device and a manufacturing method thereof.

(b) Description of the Related Art

Light emitting diode displays have attracted high attention as self-light emitting diode displays. The light emitting diode displays have a self-emitting characteristic, so they need no additional light source, differing from liquid crystal display devices, thereby reducing thickness and weight thereof. Further, the light emitting diode displays express high-quality characteristics such as low power consumption, high luminance, and high reaction rates.

In general, the light emitting diode displays respectively include a plurality of pixels, and the respective pixels include a plurality of transistors and a light-emitting device. The transistors may be connected to a scan line and a data line and may transmit a driving current to the light-emitting device.

The above information disclosed in this Background section is only for enhancement of understanding of the background of the inventive concept, and therefore it may contain information that does not form the prior art that is already known in this country to a person of ordinary skill in the art.

SUMMARY

The present inventive concept has been made in an effort to provide a display device for generation of defects caused by a foreign substance by reducing a step of a region in which transistors are disposed, and a method for manufacturing a display device.

An embodiment of the present inventive concept provides a display device including: a substrate including a signal wire area and a transistor area; a first layer disposed in the transistor area; a signal wire disposed in the signal wire area; a transistor disposed on the first layer; a first electrode electrically connected to the transistor; and an emission layer and a second electrode disposed on the first electrode, wherein the first layer and the signal wire are disposed on a same layer on the substrate, and the first layer and the signal wire have different thicknesses.

The first layer may be thinner than the signal wire.

The thickness of the first layer may be equal to or less than about 500 angstroms and the thickness of the signal wire may be from about 3,000 to about 10,000 angstroms.

The signal wire may be a data line and the data line may include a first sub-data line and a second sub-data line disposed on the first sub-data line.

The first layer and the first sub-data line may include a same material and are formed at the same time.

The first layer and the first sub-data line may include titanium.

The second sub-data line may include copper.

The display device may further include a buffer layer disposed on the signal wire and the first layer, and the buffer layer may include a first step caused by the first layer and a second step caused by the signal wire.

The first step may be lower than the second step.

The buffer layer may include an inorganic material.

Another embodiment of the present inventive concept provides a method for manufacturing a display device, including: preparing a substrate including a signal wire area and a transistor area; sequentially forming a first metal layer and a second metal layer on the substrate; forming a first photosensitive resin pattern overlapping the transistor area and a second photosensitive resin pattern overlapping the signal wire area; forming a first metal pattern using the first photosensitive resin pattern as a mask and a second metal pattern using the second photosensitive resin pattern as a mask; and removing the first photosensitive resin pattern; and removing at least part of the first metal pattern, wherein the first photosensitive resin pattern and the second photosensitive resin pattern have different thicknesses.

The removing of at least part of the first metal pattern may include removing the patterned second metal layer in the first metal pattern.

The second metal pattern may be covered by the second photosensitive resin pattern during the removing of the at least part of the first metal pattern.

The first metal pattern which is not removed may form a first layer, and the second metal pattern may form a double-layered signal wire.

The first layer and the signal wire may be disposed on a same layer on the substrate and the first layer may be thinner than the signal wire.

The thickness of the first layer may be equal to or less than about 500 angstroms, and the thickness of the signal wire may be from about 3,000 to about 10,000 angstroms.

The method may further include forming a buffer layer on the first layer and the signal wire.

The buffer layer may form a first step overlapping the first layer and may form a second step overlapping the signal wire.

The first step may be lower than the second step.

The buffer layer may include an inorganic material.

According to the embodiments, the step of the region in which the transistors are disposed may be reduced. The insulating layer positioned in the region in which the transistors are disposed is prevented from being cracked, and permeation of air or moisture through cracks may be prevented. The stably formed insulating layer may be provided so the characteristic of the transistors may be maintained, and the reliability-improved display device may be provided.

DETAILED DESCRIPTION OF THE EMBODIMENTS

Figure 1:
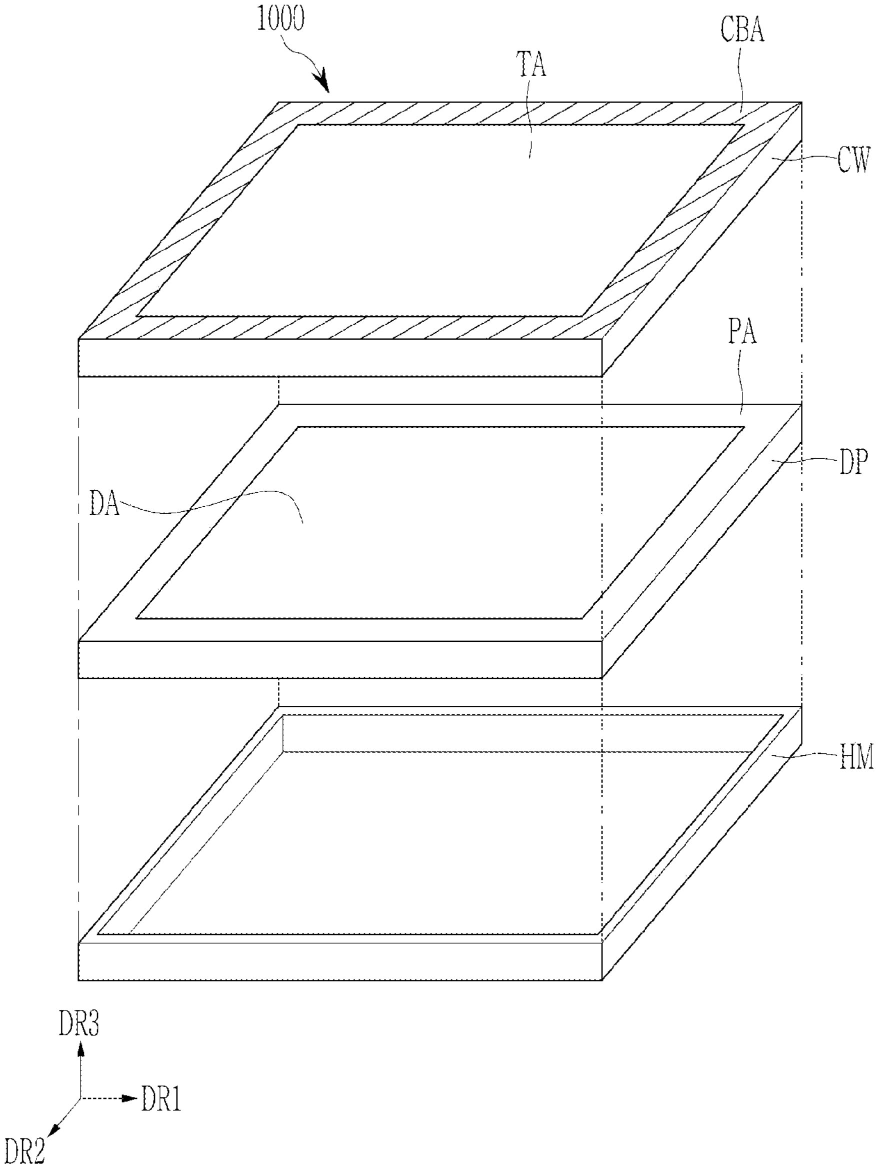
FIG. 1 shows an exploded perspective view of a display device according to an embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

Parts that are irrelevant to the description will be omitted to clearly describe the present inventive concept, and the same elements will be designated by the same reference numerals throughout the specification.

The size and thickness of each configuration shown in the drawings are arbitrarily shown for better understanding and ease of description, but the present inventive concept is not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

Figure 2:
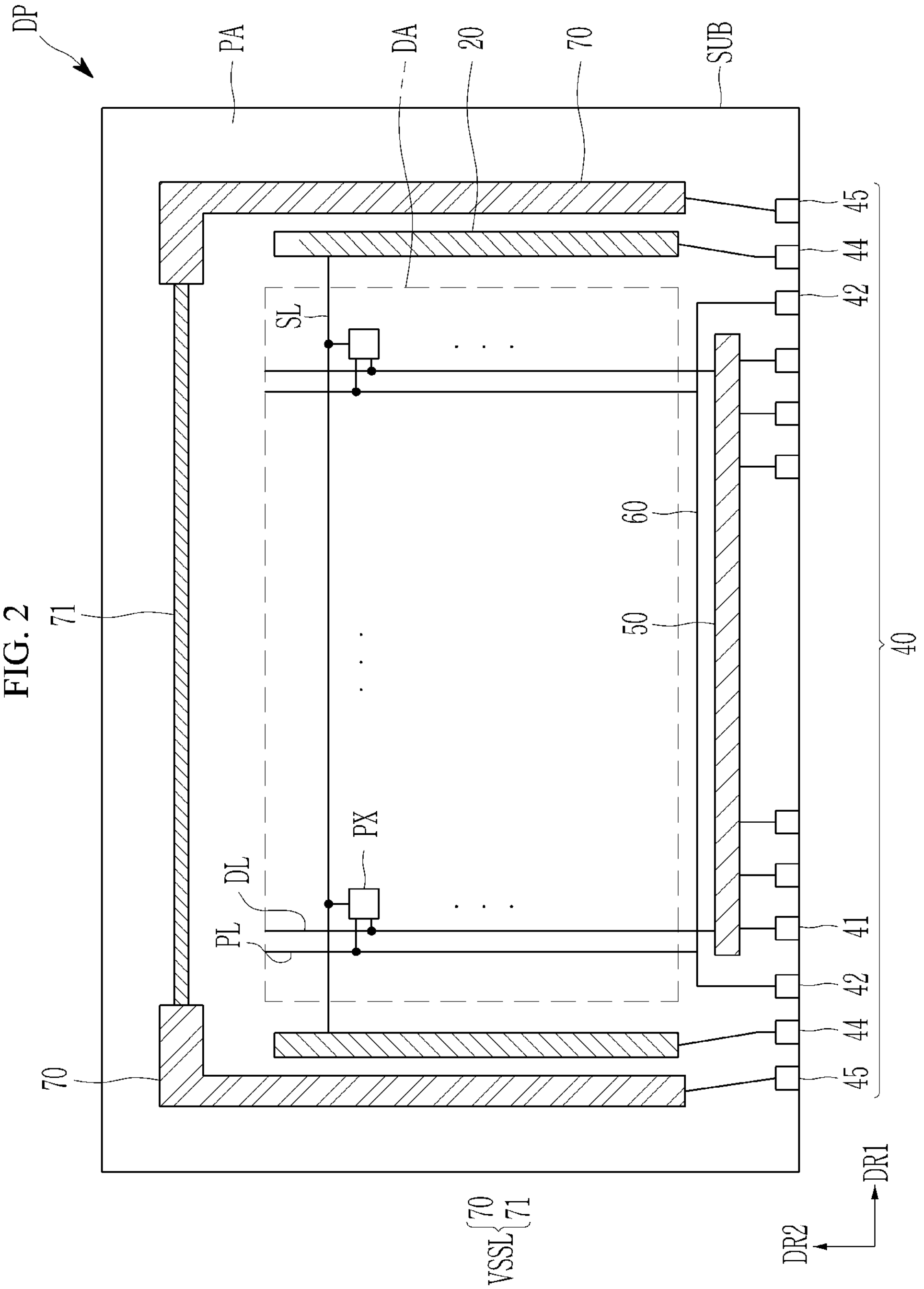
FIG. 2 shows a top plan view of a predetermined region of a display panel according to an embodiment.
Figure 3:
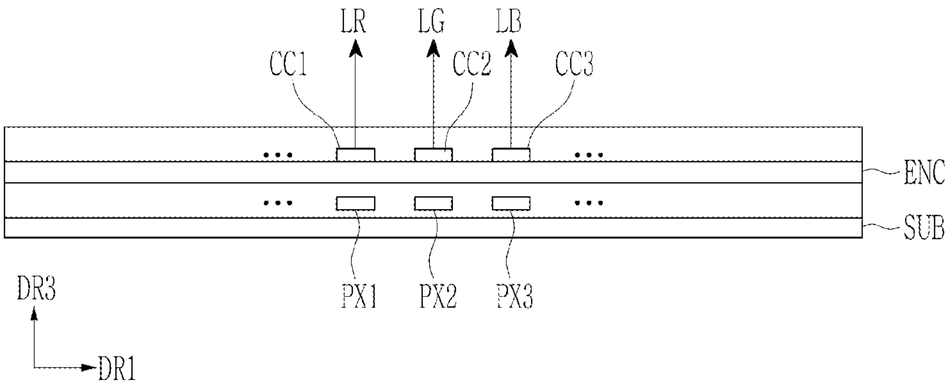
FIG. 3 shows a cross-sectional view of a display panel according to an embodiment.

A display device according to an embodiment will now be described with reference to FIG. 1 to FIG. 3. FIG. 1 shows an exploded perspective view of a display device according to an embodiment, FIG. 2 shows a top plan view of a predetermined region of a display panel according to an embodiment, and FIG. 3 shows a cross-sectional view of a display panel according to an embodiment.

Referring to FIG. 1, the display device 1000 may include a cover window CW, a display panel DP, and a housing HM.

The cover window CW may include an insulation panel. For example, the cover window CW may be made of glass, plastic, or a combination thereof.

A front side of the cover window CW may define a front side of the display device 1000. The transmission area TA may be an optically transparent region. For example, the transmission area TA may have visible ray transmittance of equal to or greater than about 90%.

A blocking area CBA may define a shape of the transmission area TA. The blocking area CBA may be disposed near the transmission area TA and may surround the transmission area TA. The blocking area CBA may have light transmittance that is relatively lower than light transmittance of the transmission area TA. The blocking area CBA may include an opaque material for blocking light. The blocking area CBA may have a predetermined color. The blocking area CBA may be defined by a bezel layer or may be defined by an ink layer inserted into or colored to the transparent substrate.

One side of the display panel DP on which images are displayed is a plane defined by a first direction DR1 and a second direction DR2. A normal direction of the one side on which the image is displayed, that is, a thickness direction of the display panel DP, is indicated by a third direction DR3. Front sides (or upper sides) and rear sides (or lower sides) of respective members are distinguished by the third direction DR3. However, the direction indicated by the first to third directions DR1, DR2, and DR3 are relative concepts, and may indicate other directions.

The display panel DP may be a flat rigid display panel, but it is not limited thereto, and it may be a flexible display panel. The display panel DP may be made of an organic light emitting panel. However, a type of the display panel DP is not limited thereto, and the display panel DP may be made of various types of panels. For example, the display panel DP may be made of a liquid crystal panel, an electrophoretic display panel, and an electro-wetting display panel. The display panel DP may be made of next-generation display panels such as a micro light emitting diode display panel, a quantum dot light emitting diode display panel, or a quantum dot organic light emitting diode display panel.

The micro light emitting diode (LED) (Micro LED) display panel includes the light emitting diodes (LED) with a size of 10 to 100 micrometers in respective pixels. The micro LED display panel may use an inorganic material, may omit a backlight, may have a fast reaction rate, may realize high luminance with lower power, and may not be broken when it is bent, which are merits. The quantum dot LED display panel may be made by attaching a quantum dot included film or forming with a quantum dot included material on a substrate. The quantum dot is made of an inorganic material such as indium or cadmium, and it emits light and includes particles with a diameter of equal to or less than several nanometers. The quantum dot may display light of a desired color by adjusting a particle size of the quantum dot. The quantum dot organic LED display panel is made by using a blue organic light emitting diode as a light source, and attaching a film including red and green quantum dots thereon or depositing a material including red and green quantum dots, thereby realizing color. The display panel DP may be made of various sorts of display panels in addition to it.

As shown in FIG. 1, the display panel DP includes a display area DA for displaying images, and a non-display area PA provided near the display area DA. The non-display area PA displays no images. The display area DA may, for example, have a square shape, and the non-display area PA may have a shape surrounding the display area DA. Without being limited thereto, the shapes of the display area DA and the non-display area PA may be relatively designed.

The housing HM provides a predetermined internal space. The display panel DP is installed in the housing HM. Various kinds of electronic parts, for example, a power supply, a storage device, or a sound input and output module may be installed in the housing HM in addition to the display panel DP.

Referring to FIG. 2, the display panel DP includes a display area DA and a non-display area PA. The non-display area PA may be defined along an edge of the display area DA.

The display panel DP includes a plurality of pixels PX. The pixels PXs may be disposed in the display area DA of the substrate SUB. The pixels PX respectively include an organic light emitting diode and a pixel driving circuit connected thereto.

The respective pixels PX may, for example, emit red, green, blue, or white light, and they may, for example, include an organic light emitting diode. The display panel DP provides a predetermined image through the light emitted by the pixels PX, and the display area DA is defined by the pixels PX. The non-display area PA where the pixels PX are not disposed provides no images.

The display panel DP may include a plurality of signal lines and a pads. The signal lines may include a scan line SL extending in the first direction DR1, and a data line DL and a driving voltage line PL extending in the second direction DR2.

The scan driver 20 is positioned in the non-display area PA of the substrate SUB. The scan driver 20 generates scan signals and transmits them to the respective pixels PX through the scan lines SL. Depending on embodiments, the scan driver 20 may be disposed on a left and a right side of the display area DA in a plan view. The present specification shows a configuration in which the scan driver 20 is disposed on both sides of the display area DA in a plan view, but the scan driver may be disposed on one side of the display area DA according to another embodiment.

The pads 40 is disposed on one end of the display panel DP and includes a plurality of terminals 41, 42, 44, and 45. The pads 40 is not covered by the insulating layer but is exposed, and it may be electrically connected to a flexible printed circuit board PCB or a controller (not shown) such as an IC.

The controller changes a plurality of image signals transmitted from an outside into a plurality of image data signals, and transmits the changed signals to the data driver 50 through the terminal 41. The controller may receive a vertical synchronization signal, a horizontal synchronizing signal, and clock signals, may generate control signals for controlling driving of the scan driver 20 and the data driver 50, and may transmit the same to the respective ones through the terminals 44 and 41. The controller transmits a driving voltage ELVDD to a driving voltage supply line 60 through the terminal 42. The controller transmits a common voltage to respective common voltage supply lines VSSL through the terminal 45.

The data driver 50 is disposed in the non-display area PA, and it generates data signals and transmits them to the respective pixels PX through the data lines DL. The data driver 50 may be disposed on one side of the display panel DP, and for example, it may be disposed between the pads 40 and the display area DA.

The driving voltage supply line 60 is disposed in the non-display area PA. For example, the driving voltage supply line 60 may be disposed between the data driver 50 and the display area DA. The driving voltage supply line 60 provides driving voltages to the pixels PX. The driving voltage supply line 60 may extend in the first direction DR1 and may be connected to a plurality of driving voltage lines PL extend in the second direction DR2.

The common voltage supply line VSSL is disposed in the non-display area PA and provides a common voltage to a common electrode of the organic light emitting diode of the pixel PX. The common voltage supply line VSSL may have a loop shape extending from one lateral side of the substrate SUB and surrounding three sides along an edge of the substrate SUB.

The common voltage supply line VSSL may include a main supply line 70 and a sub supply line 71.

Referring to FIG. 3, a plurality of pixels PX1, PX2, and PX3 may be formed on the substrate SUB corresponding to the display area DA. The respective pixels PX1, PX2, and PX3 may include a plurality of transistors and a light-emitting device connected thereto.

An encapsulation layer ENC may be positioned on the pixels PX1, PX2, and PX3. The display area DA may be protected from external air or moisture through the encapsulation layer ENC. The encapsulation layer ENC may be integrally installed to overlap a front side of the display area DA, and part thereof may be disposed in the non-display area PA.

A first color converter CC1, a second color converter CC2, and a transmitter CC3 may be positioned on the encapsulation layer ENC in areas corresponding to the pixels PX1, PX2, and PX3. The first color converter CC1 may overlap the first pixel PX1, the second color converter CC2 may overlap the second pixel PX2, and the transmitter CC3 may overlap the third pixel PX3 in a third direction DR3.

Light discharged from the first pixel PX1 may pass through the first color converter CC1 to provide red light LR. Light discharged from the second pixel PX2 may pass through the second color converter CC2 to provide green light LG. Light discharged from the third pixel PX3 may pass through the transmitter CC3 to provide blue light LB.

A stacking structure of the respective pixels PX1, PX2, and PX3 will now be described with reference to FIG. 4.

A cross-sectional diagram of a display device according to an embodiment will now be described with reference to FIG. 4. FIG. 4 shows a cross-sectional view of a display panel according to an embodiment.

Figure 4:
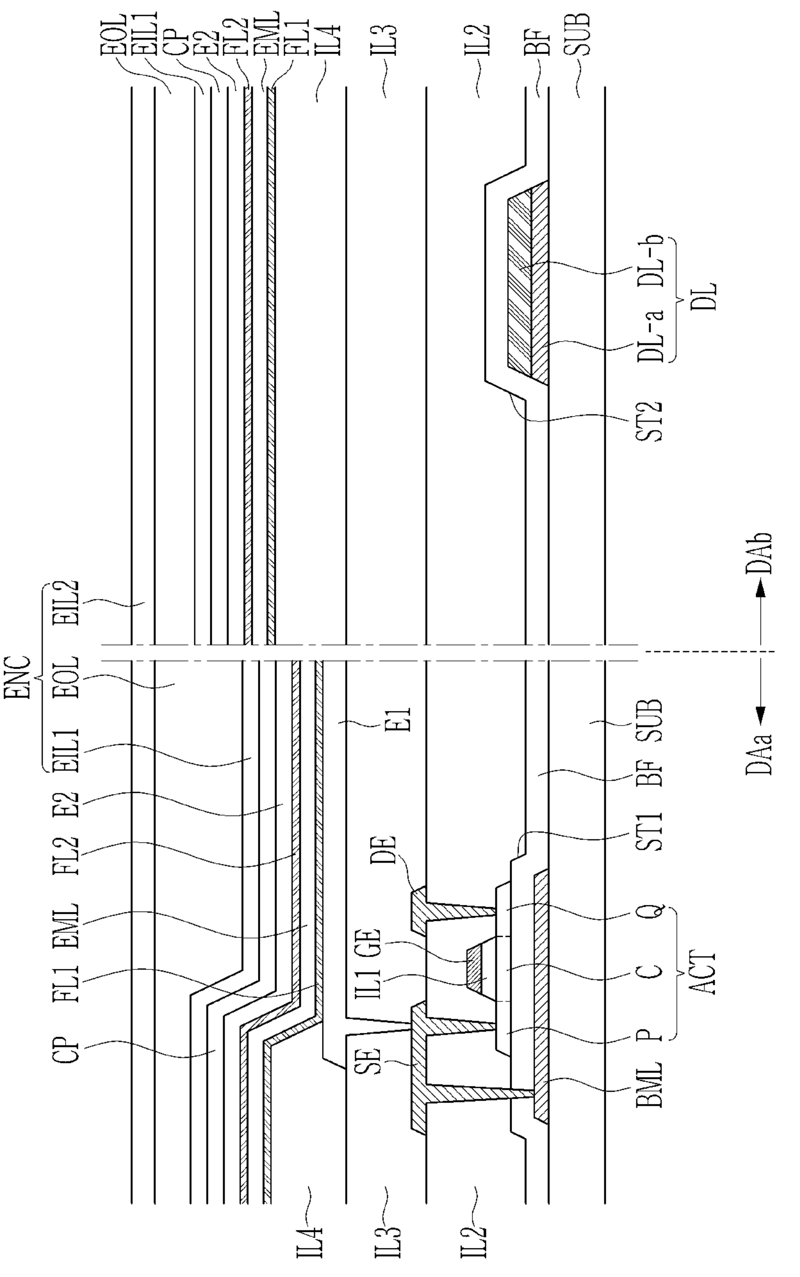
FIG. 4 shows a cross-sectional view of a display panel according to an embodiment.

Referring to FIG. 4, the substrate SUB according to an embodiment may include an inorganic insulating material such as glass or an organic insulating material such as a plastic, for example, a polyimide (PI). The substrate SUB may be a single layer or a multilayer. The substrate SUB may be made by alternately stacking at least one base layer including sequentially stacked polymer resins and at least one organic layer.

The substrate SUB may have various levels of flexibility. The substrate SUB may be a rigid substrate or a flexible substrate that may be bent, folded, or rolled.

The substrate SUB may include a transistor area DAa in which transistors are disposed and a signal wire area DAb in which signal wires are disposed.

First conductive layers BML and DL may be positioned on the substrate SUB. The first conductive layers BML and DL may be directly disposed on the substrate SUB. The first conductive layers BML and DL may include a first layer BML and a signal wire DL. The present specification describes a case in which the signal wire DL is the data line DL, but the signal wire DL is not limited thereto. The first layer BML may be positioned in the transistor area DAa, and the data line DL may be positioned in the signal wire area DAb.

The first layer BML and the data line DL may be disposed on a same layer on the substrate SUB. The first layer BML and the data line DL may have different thicknesses. The thickness of the first layer BML may be smaller than the thickness of the data line DL. For example, the thickness of the first layer BML may be equal to or less than about 500 angstroms, and the thickness of the data line DL may be about 3000 to 10,000 angstroms. The transistors are disposed on the first layer BML, and the relatively thin first layer BML is provided so the transistors may be stably formed.

The first conductive layers BML and DL may include molybdenum (Mo), aluminum (Al), copper (Cu) silver (Ag), chromium (Cr), tantalum (Ta), and titanium (Ti), and may include a single-layered structure or a multi-layered structure. Depending on embodiments, the first layer BML may be a single layer, and the data line DL may be a double layer including a first sub-data line DL-a and a second sub-data line DL-b. The first layer BML and the first sub-data line DL-a may include a same material. For example, the first layer BML and the first sub-data line DL-a may include titanium, and the second sub-data line DL-b may include copper. The first layer BML and the first sub-data line DL-a may be formed at the same time and have the same thickness.

A buffer layer BF may be positioned on the first conductive layers BML and DL. The buffer layer BF may prevent degradation of the semiconductor layer ACT by preventing impurities from being diffused to the upper layer of the buffer layer BF, particularly to the semiconductor layer ACT from the substrate SUB and release stresses. The buffer layer BF may include an inorganic insulating material such as a silicon nitride or a silicon oxide or an organic insulating material. Some or all of the buffer layer BF may be omitted.

The buffer layer BF may include a first step ST1 caused by the first layer BML and a second step ST2 caused by the data line DL. The first step ST1 and the second step ST2 may have different heights due to different thickness of the first layer BML and the signal layer DL, for example, the data line. For example, the first step ST1 may be lower than the second step ST2. In other words, the buffer layer BF overlapping the transistor area DAa may have a height relatively lower than that of the buffer layer BF overlapping the signal wire area DAb.

During a manufacturing process, a foreign substance such as particles may be positioned near the first step ST1 and the second step ST2. The foreign substances may be removed by a washing process, and the foreign substances positioned near the first step ST1 that has a relatively low height of the step may be easily removed. The foreign substances positioned in the transistor area DAa may be easily removed. Hence, the insulating layer positioned in the transistor area DAa may be stably and uniformly formed and may prevent generation of cracks due to the foreign substance such as particles.

When the step is high, the foreign substances may not be easily removed during the washing process. That is, the foreign substances in the region with a high step may not be removed and remain. The insulating layers formed on the buffer layer BF may have deteriorated uniformity due to the foreign substance that is not removed. When the uniformity of the insulating layers is deteriorated, the corresponding region may be cracked. External air or moisture may be permeated through the cracks. When the cracks are generated near the transistor, a threshold voltage of the transistor is negatively shifted. Pixels having a negatively shifted threshold voltage of the transistor may generate bright spot defects in which the pixels look relatively brighter than others.

A semiconductor layer ACT is positioned on the buffer layer BF. The semiconductor layer ACT may include at least one of polysilicon and an oxide semiconductor. The semiconductor layer ACT includes a channel region C, a first region P, and a second region Q. The first region P and the second region Q are disposed on respective sides of the channel region C. The channel region C may include a semiconductor to which few impurities are doped, and the first region P and the second region Q may include a semiconductor to which a large amount of impurities are doped compared to the channel region C. The semiconductor layer ACT may be made of an oxide semiconductor, and in this case, a protection layer (not shown) for protecting an oxide semiconductor material that is weak to external conditions such as a high temperature may be added thereto.

A first insulating layer IL1 is positioned on the semiconductor layer ACT.

A second conductive layer including a gate electrode GE is positioned on the first insulating layer ILE The gate electrode GE may be a single layer or a multilayer on which a metal film including one of copper (Cu), a copper alloy, aluminum (Al), an aluminum alloy, molybdenum (Mo), a molybdenum alloy, titanium (Ti), and a titanium alloy is stacked. The gate electrode GE may overlap the channel region C of the semiconductor layer ACT.

A second insulating layer IL2 may be positioned on the gate electrode GE and the first insulating layer ILL The first insulating layer IL1 and the second insulating layer IL2 may be a single layer or a multilayer including at least one of a silicon oxide ($SiO_x$), a silicon nitride ($SiN_x$), and a silicon oxynitride ($SiO_xN_y$).

A third conductive layer including a source electrode SE and a drain electrode DE may be positioned on the second insulating layer IL2. FIG. 4 shows a connection to other constituent elements through the source electrode SE and the drain electrode DE according to an embodiment, and FIG. 11 to FIG. 14 show a connection to other constituent elements through the third conductive layer including a plurality of connection patterns according to an embodiment.

The source electrode SE and the drain electrode DE are respectively connected to the first region P and the second region Q of the semiconductor layer ACT through contact holes formed in the insulating layers.

The source electrode SE and the drain electrode DE may include aluminum (Al), silver (Ag), magnesium (Mg), gold (Au), chromium (Cr), nickel (Ni), calcium (Ca), molybdenum (Mo), titanium (Ti), tungsten (W), and/or copper (Cu), and may have a single layer or a multilayer including the same.

A third insulating layer IL3 may be positioned on the second insulating layer IL2, the source electrode SE, and the drain electrode DE. The third insulating layer IL3 may include an organic insulating material such as a general-purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

A first electrode E1 may be positioned on the third insulating layer IL3. The first electrode E1 may be connected to the source electrode SE through a contact hole of the third insulating layer IL3.

The first electrode E1 may include a metal such as silver (Ag), lithium (Li), calcium (Ca), aluminum (Al), magnesium (Mg), or gold (Au), and may include a transparent conductive oxide (TCO) such as an indium tin oxide (ITO) or an indium zinc oxide (IZO). The first electrode E1 may include a single layer including a metal material or a transparent conductive oxide or a multilayer including the same. For example, the first electrode E1 may have a triple-layered structure of indium tin oxide (ITO)/silver (Ag)/indium tin oxide (ITO).

The transistor including a gate electrode GE, a semiconductor layer ACT, a source electrode SE, and a drain electrode DE may be connected to the first electrode E1 and may supply a current to the light-emitting device.

A partition wall IL4 may be positioned on the third insulating layer IL3 and the first electrode E1. Although not shown, a spacer (not shown) may be positioned on the partition wall IL4. The partition wall IL4 includes a partition wall opening exposing at least part of the first electrode E1 and defining a light emitting region.

The partition wall IL4 may include an organic insulating material such as a general-purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

An emission layer EML may be positioned on the first electrode E1. Functional layers FL1 and FL2 may be positioned on a lower portion and an upper portion of the emission layer EML, respectively. The first functional layer FL1 may be a multilayer including at least one of a hole injection layer HIL and a hole transporting layer HTL, and the second function layer FL2 may be a multilayer including at least one of an electron transporting layer ETL and an electron injection layer EIL. The functional layers FL1 and FL2 and the emission layer EML may overlap a front side of the substrate SUB.

The present specification shows one first functional layers FL1, one second functional layer FL2, and one emission layer EML which are stacked, but the configuration of the first functional layers FL1, the second functional layer FL2, and the emission layer EML is not limited thereto. When one of the functional layers FL1 and FL2 and the emission layer EML is referred to as a single stacking structure body, the display panel according to an embodiment may include three stacking structure bodies or four stacking structure bodies. The respective stacking structure bodies may output the same color or may output different colors. For example, the three stacking structure bodies may output blue light, and one stacking structure body may output green light.

A second electrode E2 may be positioned on the functional layers FL1 and FL2. The second electrode E2 may include a reflective metal including calcium (Ca), barium (Ba), magnesium (Mg), aluminum (Al), silver (Ag), gold (Au), nickel (Ni), chromium (Cr), lithium (Li), and calcium (Ca), or a transparent conductive oxide (TCO) including an indium tin oxide (ITO) and an indium zinc oxide (IZO).

The first electrode E1, the emission layer EML, the functional layers FL1 and FL2, and the second electrode E2 may constitute a light-emitting device. Here, the first electrode E1 may be an anode that is a hole injection electrode, and the second electrode E2 may be a cathode that is an electron injection electrode. However, the embodiment is not limited thereto, and the first electrode E1 may be a cathode, and the second electrode E2 may be an anode according to a method for driving a light emitting diode display.

When the holes and the electrons are injected into the emission layer EML from the first electrode E1 and the second electrode E2, and excitons that are a combination of the injected holes and electrons fall to a ground state from an excited state, light emits.

An encapsulation layer ENC is positioned on the second electrode E2. The encapsulation layer ENC may cover the upper side of the light-emitting device and the lateral side to seal them. As the light-emitting device is very weak against moisture and oxygen, the encapsulation layer ENC seals the light-emitting device to prevent inflow of moisture and oxygen in to the light-emitting device.

The encapsulation layer ENC may include a plurality of layers, it may be formed of a multilayer including an inorganic layer and an organic layer, and for example, it may be formed to be a triple layer of the sequentially stacked first encapsulating inorganic layer EIL1, the encapsulating organic layer EOL, and the second encapsulating inorganic layer EIL2.

The first encapsulation inorganic layer EIL1 may cover the second electrode E2. The first encapsulation inorganic layer EIL1 may prevent external moisture or oxygen from permeating into the light-emitting device. For example, the first encapsulation inorganic layer EIL1 may include a silicon nitride, a silicon oxide, a silicon oxynitride, and a combination thereof. The first encapsulation inorganic layer EIL1 may be formed by a deposition process.

The encapsulation organic layer EOL may be disposed on the first encapsulating inorganic layer EIL1 and may contact the first encapsulating inorganic layer EIL1 Steps formed on the upper side of the first encapsulating inorganic layer EIL1 or particles provided on the first encapsulating inorganic layer EIL1 are covered by the encapsulating organic layer EOL, so that constituents formed on the encapsulating organic layer EOL may not be affected by a surface state of the first encapsulating inorganic layer EIL1 The encapsulation organic layer EOL may ease the stress among layers contacting each other. The encapsulation organic layer EOL may include an organic material and may be formed through a solution process such as spin coating, slit coating, or an inkjet process.

The second encapsulation inorganic layer EIL2 is disposed on the encapsulating organic layer EOL to cover the encapsulating organic layer EOL. The second encapsulation inorganic layer EIL2 may be more stably formed on a relatively planar surface of the encapsulating organic layer EOL than formed on the first encapsulating inorganic layer EIL1 which has steps. The second encapsulation inorganic layer EIL2 encapsulates moisture discharged from the encapsulating organic layer EOL to prevent its outflow to the outside. The second encapsulation inorganic layer EIL2 may include a silicon nitride, a silicon oxide, a silicon oxynitride, and a combined compound thereof. The second encapsulation inorganic layer EIL2 may be formed through a deposition process.

A capping layer CP may be positioned between the second electrode E2 and the encapsulation layer ENC. The capping layer CP may include an organic material. The capping layer CP protects the second electrode (E2) from a subsequent process, for example, a sputtering process, and improves light outputting efficiency of the light-emitting device. The capping layer CP may have a greater refractive index than the first encapsulating inorganic layer EIL1.

The relatively thin first layer BML may be provided in the transistor area DAa. A plurality of insulating layers BF, IL1 and IL2 formed on the first layer BML may include low steps. The insulating layers BF, IL1 and IL2 that are formed on the relatively thin first layer BML may not be cracked, and permeation of external air or moisture through cracks may be prevented. Reliability of the transistors may be improved, and displaying quality of the display device including them may be improved.

A relatively thick data line DL may be provided in the signal wire area Dab to reduce resistance. No other transistors are disposed on the data line DL, so it may be possible to provide a stable structure regardless of the step.

A process for manufacturing a display device according to an embodiment will now be described with reference to FIG. 5 to FIG. 9. FIG. 5 to FIG. 9 show cross-sectional views of a process for manufacturing a display device according to an embodiment.

Figure 5:
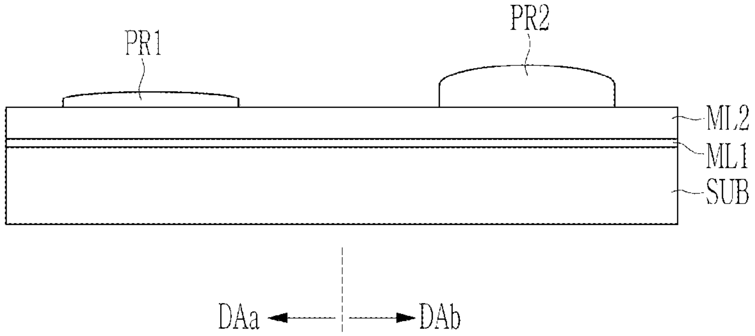
FIG. 5, 6, 7, 8 and FIG. 9 show cross-sectional views of a process for manufacturing a display device according to an embodiment.

Referring to FIG. 5, a first metal layer ML1 and a second metal layer ML2 are formed on the substrate SUB. The first metal layer ML1 and the second metal layer ML2 may be formed to cover the entire surface of the substrate SUB. The first metal layer ML1 may include titanium (Ti), and the second metal layer ML2 may include copper (Cu). However, without being limited thereto, the first metal layer ML1 and the second metal layer ML2 may respectively include molybdenum (Mo), aluminum (Al), copper (Cu) silver (Ag), chromium (Cr), tantalum (Ta), or titanium (Ti).

The first metal layer ML1 may be thinner than the second metal layer ML2. For example, the thickness of the first metal layer ML1 may be equal to or less than about 500 angstroms, and the thickness of the second metal layer ML2 may be equal to or less than about 2500 to about 9500 angstroms.

A first photosensitive resin pattern PR1 and a second photosensitive resin pattern PR2 may be formed on the second metal layer ML2. The first photosensitive resin pattern PR1 may be disposed in the transistor area DAa, and the second photosensitive resin pattern PR2 may be disposed in the signal wire area DAb. The signal wire may, for example, be a data line, a common voltage line, an initialization voltage line, or a driving voltage line, and it is not limited thereto.

The first photosensitive resin pattern PR1 may be thinner than the second photosensitive resin pattern PR2. The thickness of the first photosensitive resin pattern PR1 may be equal to or less than half the thickness of the second photosensitive resin pattern PR2. The first photosensitive resin pattern PR1 and the second photosensitive resin pattern PR2 may be simultaneously formed using a halftone mask.

Figure 6:
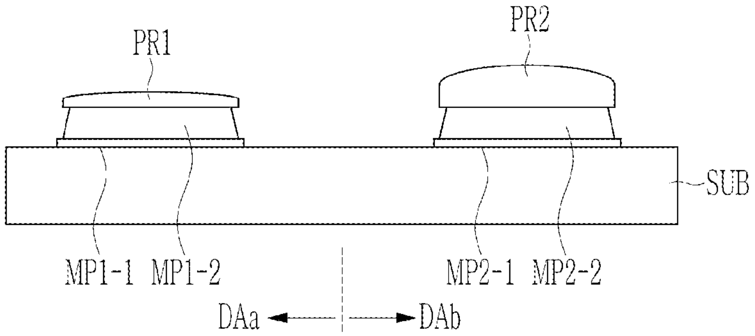

Referring to FIG. 6, the first metal layer ML1 and the second metal layer ML2 may be etched by use of a first etchant. The first etchant includes any types of etchants for simultaneously etching the first metal layer ML1 and the second metal layer ML2, and for example, the first etchant may include ammonium persulfate (APS), a nitric acid compound, and a fluorinate compound. The ammonium persulfate may be a main oxidizing agent of copper, the nitric acid compound may be an auxiliary oxidizing agent of copper, and the fluorinate compound may etch a film including titanium.

A first-1 metal pattern MP1-1 and a first-2 metal pattern MP1-2 overlapping the first photosensitive resin pattern PR1 may be formed by the etching process using the first etchant. A second-1 metal pattern MP2-1 and a second-2 metal pattern MP2-2 overlapping the second photosensitive resin pattern PR2 may be formed by the etching process using the first etchant.

Figure 7:
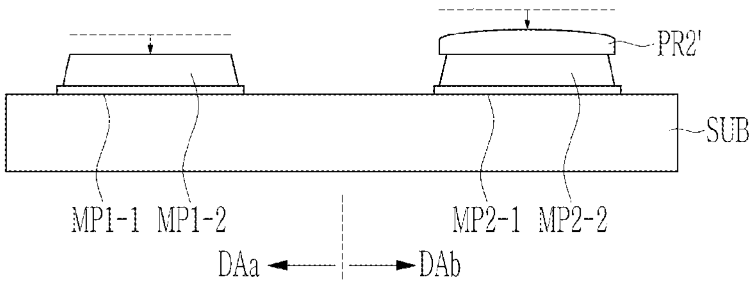

Referring to FIG. 7, the first photosensitive resin pattern PR1 and the second photosensitive resin pattern PR2 may be etched by dry etching.

The relatively thin first photosensitive resin pattern PR1 may be completely removed through the dry etching process. The first-2 metal pattern MP1-2 has no reactivity to the dry etching so it may not be etched after the first photosensitive resin pattern PR1 is removed. The etched second-1 photosensitive resin pattern PR2' may have a shape generated by etching the second photosensitive resin pattern PR2 to a thickness that is similar to that of the first photosensitive resin pattern PR1.

Figure 8:
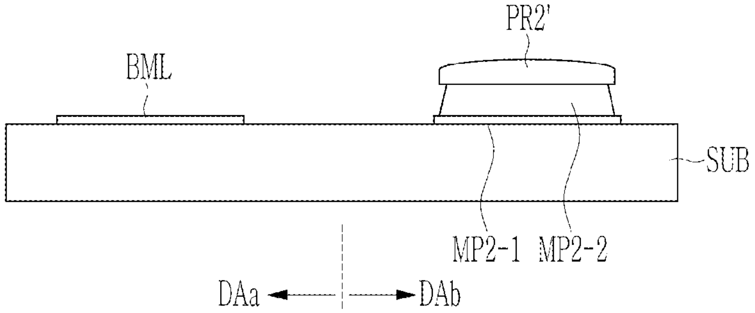

Referring to FIG. 8, the first-2 metal pattern MP1-2 may be removed by using a second etchant for selectively etching the first-2 metal pattern MP1-2. By this, the first layer BML disposed in the transistor area DAa may be formed.

The second-2 metal pattern MP2-2 includes the same material as the first-2 metal pattern MP1-2 and is covered by the second-1 photosensitive resin pattern PR2' so it may not be etched by the second etchant. The second etchant may selectively etch the copper (Cu), and may not etch titanium (Ti) because the second etchant includes no fluorinate compound.

Figure 9:
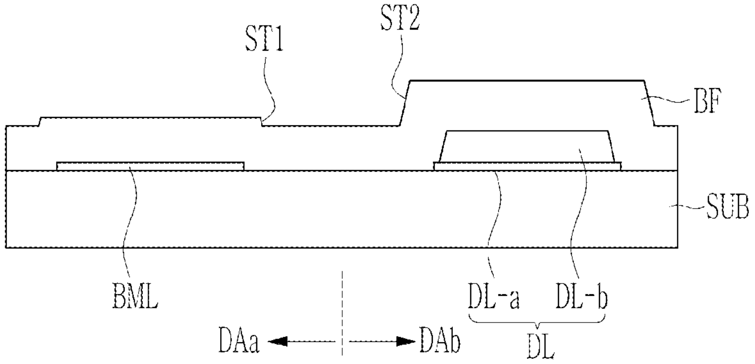

The second-1 photosensitive resin pattern PR2' may be removed. When the second-1 photosensitive resin pattern PR2' is removed, a signal wire may be formed. For example, the signal wire may be a data line, a common voltage line, an initialization voltage line, or a driving voltage line, and it is not limited thereto. As shown in FIG. 9 the signal wire may be the data line DL and may include a first sub-data line DL-a and a second sub-data line DL-b.

Referring to FIG. 9, a buffer layer BF may be formed on the first layer BML and the signal wire including the data line DL. The buffer layer BF may be formed at the front surface of the substrate SUB. The buffer layer BF may be formed to have a substantially uniform thickness at the front surface of the substrate SUB.

The buffer layer BF may include a first step ST1 formed in regions corresponding to the first layer BML and a second step ST2 formed in regions corresponding to the data line DL. The first layer BML may be relatively thinner than the data line DL, and the first step ST1 formed on the first layer BML may be relatively lower than the second step ST2 formed on the data line DL. As the data line DL further includes the second sub-data line DL-b, it may be relatively thicker than the first layer BML. The second step ST2 may be relatively higher than the first step ST1.

A plurality of constituent elements may be stacked on the buffer layer BF, thus provide the display panel according to an embodiment.

The buffer layer BF disposed in the transistor area DAa may have a relatively gentler step than the buffer layer BF disposed in the signal wire area DAb.

During the manufacturing process, a foreign substance such as particles may be positioned near the first step ST1 and the second step ST2. The foreign substances may be removed by the washing process, and the foreign substances positioned around the first step ST1 with a relatively low step may be easily removed. The foreign substances positioned in the transistor area DAa may be easily removed. Therefore, the insulating layer positioned in the transistor area DAa may be stably and uniformly formed, and generation of cracks by the foreign substances such as particles may be prevented.

Figure 10:
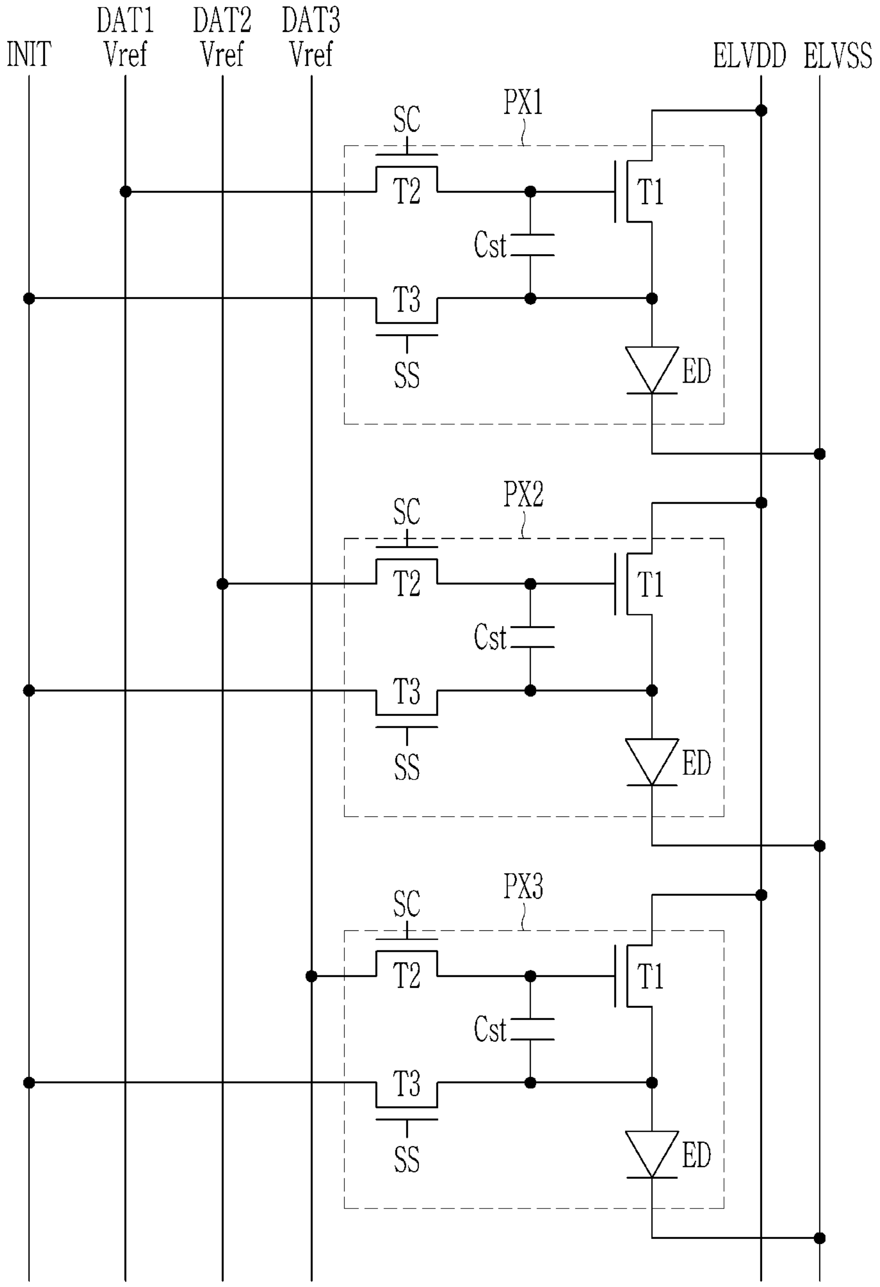
FIG. 10 shows a circuit diagram of one pixel.

An operation and a configuration of one pixel according to an embodiment will now be described with reference to FIG. 10 to FIG. 15. FIG. 10 shows a circuit diagram of one pixel, and FIG. 11 to FIG. 15 show top plan views on some configurations of a display device according to an embodiment.

Referring to FIG. 10, the display device includes a plurality of pixels PX1, PX2, and PX3. As shown in FIG. 1, the pixels PX1, PX2, and PX3 may respectively include a plurality of transistors T1, T2, and T3, a capacitor Cst, and at least one light emitting diode (ED) that is a light-emitting device. In the present embodiment, an example in which one of the pixels PX1, PX2, and PX3 includes one light emitting diode ED will be generally described.

The transistors T1, T2, and T3 include a driving transistor T1, a switching transistor T2, and an initialization transistor T3. A first electrode and a second electrode to be described below distinguish two electrodes positioned on respective sides of the channels of the transistors T1, T2, and T3, and they may be a source electrode or a drain electrode.

A gate electrode of the driving transistor T1 is connected a first node of the capacitor Cst. The first electrode of the first driving transistor T1 is connected to a driving voltage line for transmitting a driving voltage ELVDD. The second electrode of the driving transistor T1 is connected to an anode of the light emitting diode ED and a second node of the capacitor Cst. The driving transistor T1 may receive data voltages DAT1, DAT2, and DAT3 from the data line according to a switching operation of the switching transistor T2, and may supply a driving current to the light emitting diode ED according to a voltage stored in the capacitor Cst.

A gate electrode of the switching transistor T2 is connected to a first scan line for transmitting a first scan signal SC. A first electrode of the switching transistor T2 is connected to the data line for transmitting the data voltages DAT1, DAT2, and DAT3 or a reference voltage. A second electrode of the switching transistor T2 is connected to the first node of the capacitor Cst and the gate electrode of the driving transistor T1. The switching transistor T2 may be turned on in response to a first scan signal SC and may transmit the reference voltage or the data voltages DAT1, DAT2, and DAT3 to the gate electrode of the driving transistor T1 and the first node of the capacitor Cst.

A gate electrode of the initialization transistor T3 is connected to a second scan line for transmitting a second scan signal SS. A first electrode of the initialization transistor T3 is connected to the second node of the capacitor Cst, the second electrode of the driving transistor T1, and the anode of the light emitting diode ED. A second electrode of the initialization transistor T3 is connected to an initialization voltage line for transmitting an initialization voltage INIT. The initialization transistor T3 is turned on in response to the second scan signal SS to transmit the initialization voltage INIT to the anode of the light emitting diode ED and the second node of the capacitor Cst and initialize a voltage at the anode of the light emitting diode ED.

The first node of the capacitor Cst is connected to the gate electrode of the driving transistor T1. The second node of the capacitor Cst is connected to the first electrode of the initialization transistor T3 and the anode of the light emitting diode ED. The cathode of the light emitting diode ED is connected to the common voltage line for transmitting a common voltage ELVSS.

The light emitting diode ED may emit light with luminance according to a driving current generated by the driving transistor T1.

An example of an operation of a circuit shown in FIG. 10, and particularly, an example of an operation for one frame will now be described. Here, a case in which the transistors T1, T2, and T3 are n-channel transistors will be exemplified, but the type of the transistors T1, T2, and T3 is not limited thereto.

When one frame starts, a high-level first scan signal SC and a high-level second scan signal SS are supplied in an initialization section, and the switching transistor T2 and the initialization transistor T3 are turned on. The reference voltage $V_{REF}$ provided by the data line is supplied to the gate electrode of the driving transistor T1 and the first end of the capacitor Cst through the turned-on switching transistor T2, and the initialization voltage INIT is supplied to the second electrode region of the driving transistor T1 and the anode of the light emitting diode ED through the turned-on initialization transistor T3. Hence, for the initialization section, the second electrode region of the driving transistor T1 and the anode of the light emitting diode ED are initialized with the initialization voltage INIT. In this instance, a difference voltage between the reference voltage and the initialization voltage INIT is stored in the capacitor Cst.

For a sensing section, when first scan signal SC is maintained as the high-level while the second scan signal SS becomes low-level, the switching transistor T2 maintains turned on state and the initialization transistor T3 is turned off. The gate electrode of the driving transistor T1 and the first node of the capacitor Cst maintain the reference voltage through the turned-on switching transistor T2, and the second electrode region of the driving transistor T1 and the anode of the light emitting diode ED are disconnected from the initialization voltage INIT when the initialization transistor T3 is turned off. Accordingly, the current may flow from the first electrode to the second electrode of the driving transistor T1 until the voltage of the second electrode of the driving transistor T1 becomes "reference voltage-Vth". Vth represents the threshold voltage of the driving transistor T1. The voltage difference between the gate electrode of the driving transistor T1 and the second electrode is stored in the capacitor Cst, and sensing of the threshold voltage Vth of the driving transistor T1 is completed. Characteristic deviations of the driving transistor T1 that may be different for the respective pixels may be externally compensated by generating the data signal compensated by reflecting characteristic information sensed for the sensing section.

In a data input section, when the high-level first scan signal SC is supplied and the low-level second scan signal SS is supplied, the switching transistor T2 is turned on and the initialization transistor T3 is turned off. The data voltages DAT1, DAT2, and DAT3 from the data line are supplied to the gate electrode of the driving transistor T1 and the first node of the capacitor Cst through the turned-on switching transistor T2. In this instance, as the driving transistor T1 is turned off, the second electrode of the driving transistor T1 and the anode of the light emitting diode ED may substantially maintain a potential in the sensing section.

In a light emitting section, the driving transistor T1 turned on by the data voltages DAT1, DAT2, and DAT3 transmitted to the gate electrode generates a driving current according to the data voltages DAT1, DAT2, and DAT3, and the light emitting diode ED may emit light by the driving current.

A layout diagram of one pixel for driving the above-described circuit will now be described.

Figure 11:
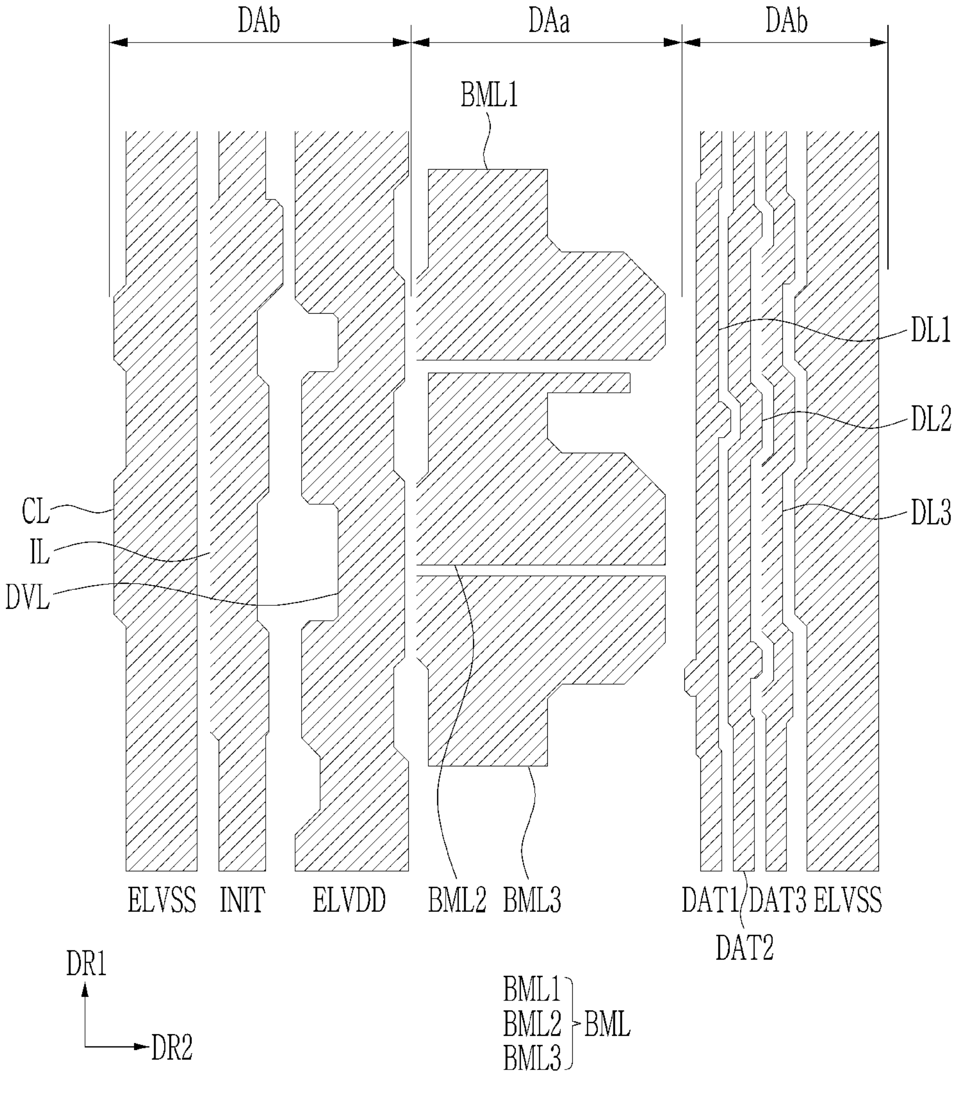
FIG. 11, 12, 13, 14 and FIG. 15 show top plan views on some configurations of a display device according to an embodiment.

Referring to FIG. 4 and FIG. 11, a first conductive layer including a first data line DL1, a second data line DL2, and a third data line DL3 may be formed on the substrate SUB. FIG. 11 shows the first conductive layer.

The first data line DL1, the second data line DL2, and the third data line DL3 extend in the first direction DR1. The first data line DL1, the second data line DL2, and the third data line DL3 may have bar shapes having predetermined widths and extending in the first direction DR1. The first data line DL1, the second data line DL2, and the third data line DL3 may be positioned adjacent to each other in a second direction DR2 traversing the first direction DR1. The first data line DL1, the second data line DL2, and the third data line DL3 may be spaced from each other with predetermined gaps disposed therebetween. The data voltages DAT1, DAT2, and DAT3 that are different from each other may be applied to the first data line DL1, the second data line DL2, and the third data line DL3, and may be disposed to be spaced apart from each other so that they may not be short-circuited. The first direction DR1 may be a column direction, and the second direction DR2 may be a row direction. The first direction DR1 may be orthogonal to the second direction DR2. The second data line DL2 may be positioned adjacent to the right side of the first data line DL1, and the third data line DL3 may be positioned adjacent to the right side of the second data line DL2. The expression that the data lines DL1, DL2, and DL3 are positioned adjacent to each other signifies that no other wires extending in parallel to the data lines DL1, DL2, and DL3 are positioned among the data lines DL1, DL2, and DL3. That is, no other wires extending in parallel to the first data line DL1 and the second data line DL2 that are adjacent to each other are positioned between the first data line DL1 and the second data line DL2. No other wires are positioned between the second data line DL2 and the third data line DL3 that are adjacent to each other.

The first conductive layer may further include a common voltage line CL, an initialization voltage line IL, a driving voltage line DVL, and a first layer BML.

The common voltage line CL, the initialization voltage line IL, and the driving voltage line DVL extend in the first direction DR1. The common voltage line CL, the initialization voltage line IL, and the driving voltage line DVL may extend in parallel to the first to third data lines DL1, DL2, and DL3. The common voltage line CL, the initialization voltage line IL, and the driving voltage line DVL may be positioned to be adjacent to each other in the second direction DR2. The common voltage line CL, the initialization voltage line IL, and the driving voltage line DVL may be positioned to be spaced from each other with a predetermined interval. The common voltage ELVSS may be applied to the common voltage line CL, the initialization voltage INIT may be applied to the initialization voltage line IL, and the driving voltage ELVDD may be applied to the driving voltage line DVL. The common voltage line CL, the initialization voltage line IL, and the driving voltage line DVL to which different voltages are applied may be spaced apart from each other so that they may not be short-circuited. The initialization voltage line IL may be positioned between the common voltage line CL and the driving voltage line DVL. However, their positions are not limited thereto and they are changeable.

The first layer BML may be positioned between the driving voltage line DVL and the first data line DL1 in a plan view. The first to third pixels PX1, PX2, and PX3 respectively include the first layer BML, and a plurality of first layers BML may be positioned near each other in the first direction DR1. In a plan view, a first layer BML2 of the second pixel PX2 may be positioned at a lower side of the first layer BML1 of the first pixel PX1, and a first layer BML3 of the third pixel PX3 may be positioned at a lower side of the first layer BML2 of the second pixel PX2.

The first layer BML may have a polygonal shape in a plan view. The shapes of the first layers BML of the pixels PX1, PX2, and PX3 in a plan view may be the same or may be different from each other. For example, the shapes of the first layer BML1 of the first pixel PX1 and the first layer BML2 of the second pixel PX2 in a plan view may be symmetrical to each other, and the shapes of the first layer BML2 of the second pixel PX2 and the first layer BML3 of the third pixel PX3 in a plan view may be identical to each other.

The first conductive layer may include molybdenum (Mo), aluminum (Al), copper (Cu) silver (Ag), chromium (Cr), tantalum (Ta), and/or titanium (Ti), and may include a single- or multi-layered structure. For example, the first conductive layer may include a double-layered structure including a layer including titanium and a layer including copper.

The first layer BML may include a single layer and at least one of the data lines DL1, DL2, and DL3 corresponding to the signal wires, the common voltage line CL, the initialization voltage line IL, and the driving voltage line DVL may include a double layer.

The first layer BML may include a titanium layer, and the data lines DL1, DL2, and DL3 corresponding to the signal wires may include a double layer which includes a titanium layer and a copper layer. The detailed structure thereof corresponds to what is described with reference to FIG. 4 and will not be described.

A buffer layer BF that is an insulating layer may be positioned on the first conductive layer including the first data line DL1, the second data line DL2, the third data line DL3, the common voltage line CL, the initialization voltage line IL, the driving voltage line DVL, and the first layer BML.

The buffer layer BF formed on the first layer BML may have a first step ST1 as described above. The buffer layer BF formed on the data lines DL1, DL2, and DL3 may have a second step ST2 as described above.

Figure 12:
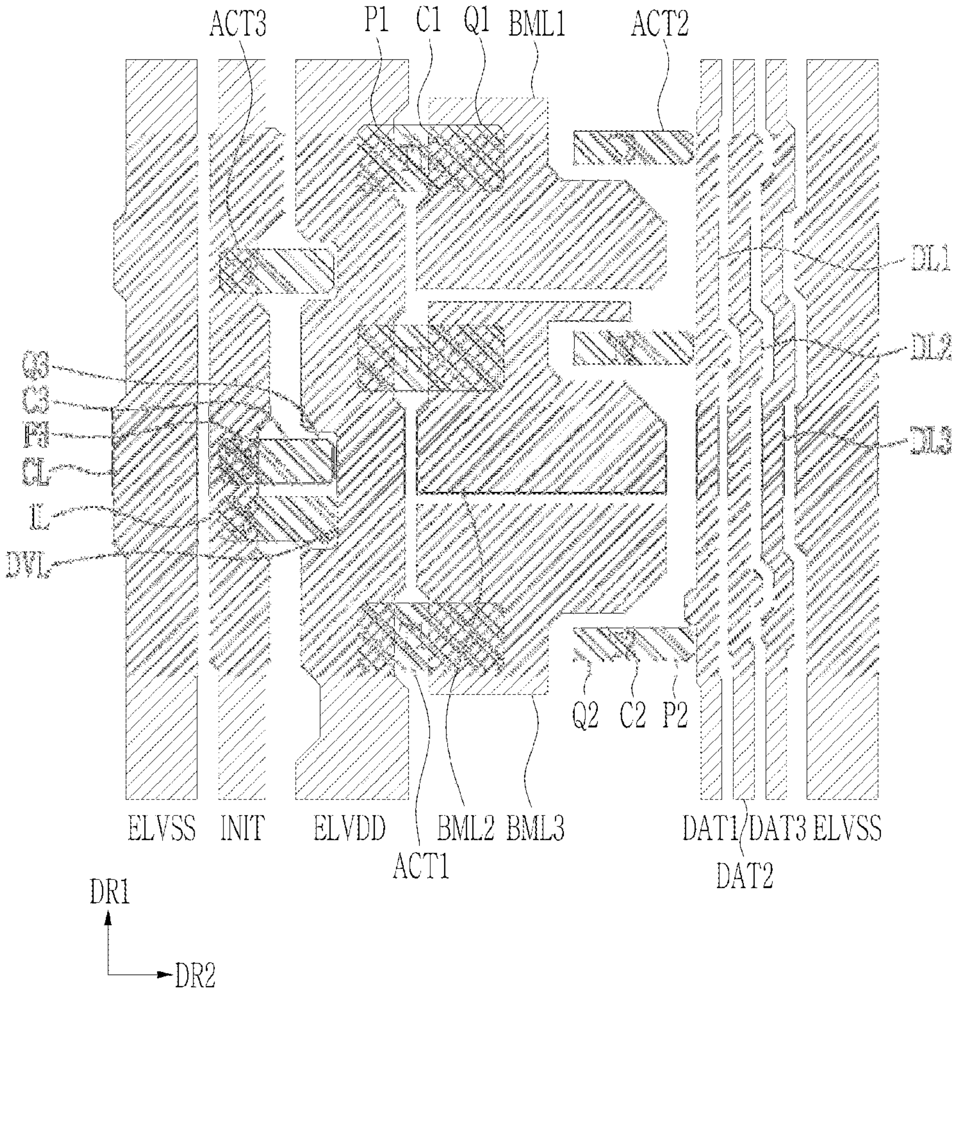

Referring to FIG. 4, FIG. 11, and FIG. 12, a first semiconductor layer ACT1 including a channel C1, a first region P1, and a second region Q2 of the first transistor T1, a second semiconductor layer ACT2 including a channel C2, a first region P2, and a second region Q2 of the second transistor T2, and a third semiconductor layer ACT3 including a channel C3, a first region P3, and a second region Q3 of the third transistor T3 of the first to third pixels PX1, PX2, and PX3 may be positioned on the buffer layer BF. FIG. 12 shows a first conductive layer and a semiconductor layer. The semiconductor layer may include a semiconductor material such as amorphous silicon, polysilicon, or an oxide semiconductor.

The channel C1, the first region P1, and the second region Q1 of the driving transistor T1 may have bar shapes extending in the second direction DR2. The channel C1 of the driving transistor T1 may be positioned between the first region P1 and the second region Q1. The first region P1 of the driving transistor T1 may overlap the driving voltage line DVL. The first region P1 of the driving transistor T1 may be electrically connected to the driving voltage line DVL, and may receive the driving voltage ELVDD from the driving voltage line DVL. The first region P1 of the driving transistor T1 may be electrically connected to the driving voltage line DVL through an additional connection pattern. The first semiconductor layer ACT1 of the driving transistor T1 may overlap the first conductive layer. Particularly, the first region P1 may overlap the driving voltage line DVL, and the channel C1 and the second region Q1 may overlap the first layer BML.

The driving transistors T1 of the first to third pixels PX1, PX2, and PX3 may be sequentially positioned in the first direction DR1. That is, in a plan view, the driving transistor T1 of the second pixel PX2 may be positioned on a lower side of the driving transistor T1 of the first pixel PX1, and the driving transistor T1 of the third pixel PX3 may be positioned on a lower side of the driving transistor T1 of the second pixel PX2.

The channel C2, the first region P2, and the second region Q2 of the switching transistor T2 may extend in the second direction DR2. The channel C2 of the switching transistor T2 may be positioned between the first region P2 and the second region Q2. The first region P2 of the switching transistor T2 may be connected to the data lines DL1, DL2, and DL3. The first region P2 of the switching transistor T2 of the first pixel PX1 may be connected to the first data line DL1. The first region P2 of the switching transistor T2 of the second pixel PX2 may be connected to the second data line DL2. The first region P2 of the switching transistor T2 of the third pixel PX3 may be connected to the third data line DL3. The first regions P2 of the switching transistors T2 of the first to third pixels PX1, PX2, and PX3 may be electrically connected to the data lines DL1, DL2, and DL3, respectively, through an additional connection pattern. The switching transistors T2 of the first to third pixels PX1, PX2, and PX3 may be sequentially positioned in the first direction DR1. That is, in a plan view, the switching transistor T2 of the second pixel PX2 may be positioned on a lower side of the switching transistor T2 of the first pixel PX1, and the switching transistor T2 of the third pixel PX3 may be positioned on a lower side of the switching transistor T2 of the second pixel PX2. The switching transistors T2 of the first to third pixels PX1, PX2, and PX3 are connected to the different data lines DL1, DL2, and DL3.

The channel C3, the first region P3, and the second region Q3 of the initialization transistor T3 may have bar shapes extending in the second direction DR2. The channel C3 of the initialization transistor T3 may be positioned between the first region P3 and the second region Q3. The first region P3 of the initialization transistor T3 may overlap the initialization voltage line IL. The first region P3 of the initialization transistor T3 may be connected to the initialization voltage line IL, and may receive the initialization voltage INIT. However, the first region P3 of the initialization transistor T3 may be electrically connected to the initialization voltage line IL through an additional connection pattern.

The initialization transistors T3 of the first to third pixels PX1, PX2, and PX3 may be sequentially positioned in the first direction DR1. That is, in a plan view, the initialization transistor T3 of the second pixel PX2 may be positioned on a lower side of the initialization transistor T3 of the first pixel PX1, and the initialization transistor T3 of the third pixel PX3 may be positioned on a lower side of the initialization transistor T3 of the second pixel PX2.

A first insulating layer IL1 may be positioned on the semiconductor layers ACT1, ACT2, and ACT3 including the channel C1, the first region P1, and the second region Q1 of the driving transistor T1, the channel C2, the first region P2, and the second region Q2 of the switching transistor T2, and the channel C3, the first region P3, and the second region Q3 of the initialization transistor T3.

Figure 13:
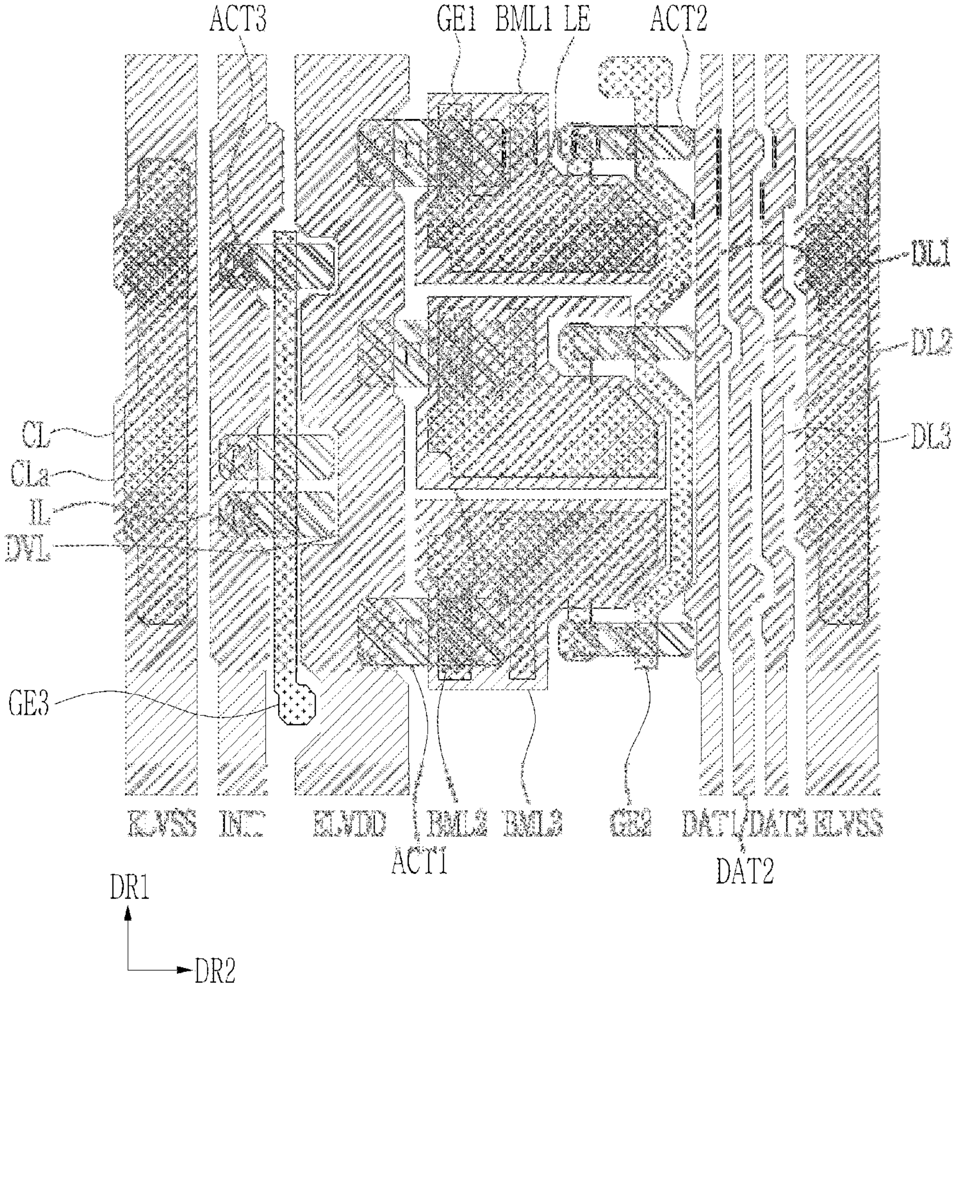
Figure 14:
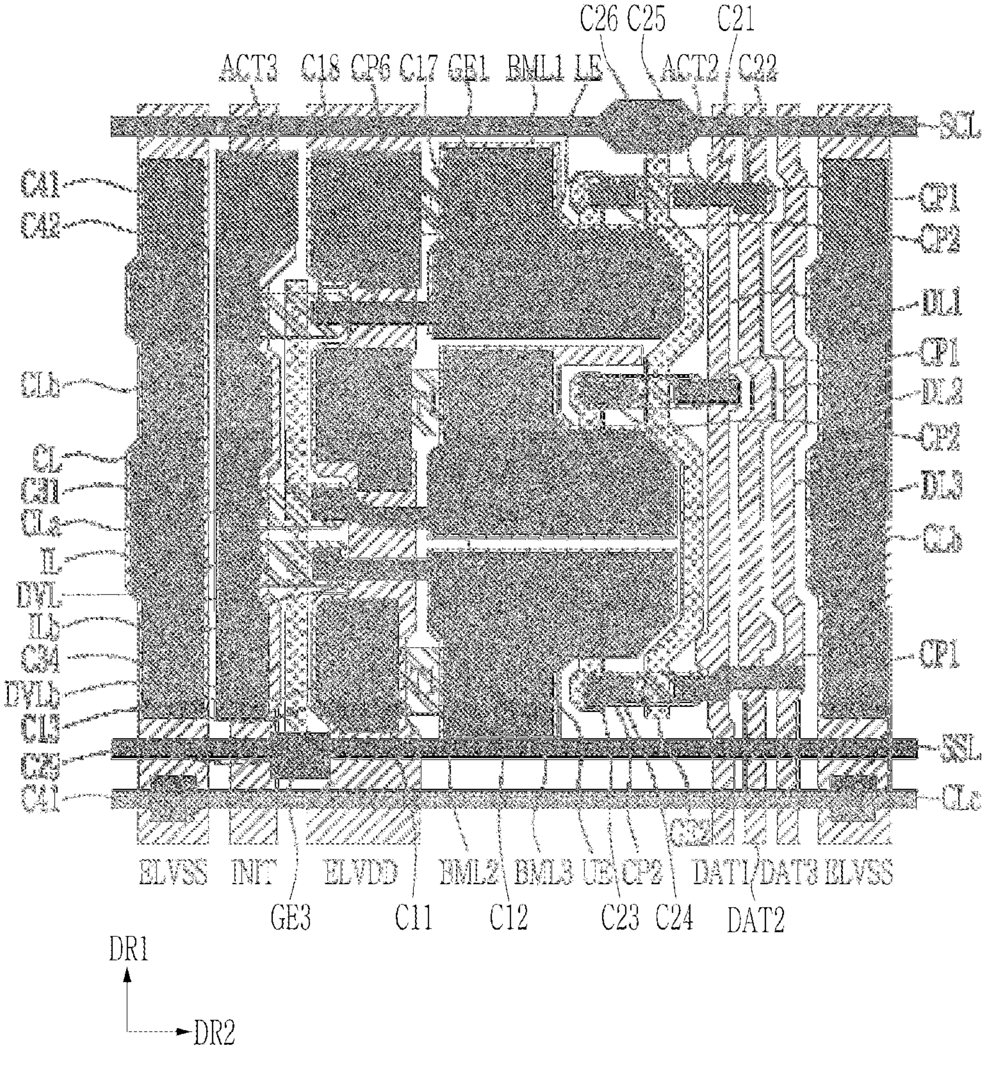

Referring to FIG. 4, FIG. 11, FIG. 12 and FIG. 13, a second conductive layer including the gate electrode GE1 of the driving transistor T1, the gate electrode GE2 of the switching transistor T2, the gate electrode GE3 of the initialization transistor T3, and the lower storage electrode LE of the first to third pixels PX1, PX2, and PX3 may be positioned on the first insulating layer IL1. FIG. 13 shows a first conductive layer, a semiconductor layer, and a second conductive layer.

The gate electrode GE1 of the driving transistor T1 may overlap the channel C1 of the driving transistor T1. The gate electrode GE1 of the driving transistor T1 may be connected to the lower storage electrode LE and may be integrally formed with the lower storage electrode LE. The lower storage electrode LE may overlap the second region Q2 of the switching transistor T2. The lower storage electrode LE may be connected to the second region Q2 of the switching transistor T2. However, the lower storage electrode LE may not be directly connected to the second region Q2 of the switching transistor T2.

The lower storage electrode LE may have a polygonal shape in a plan view. The shapes of the lower storage electrodes LE of the first to third pixels PX1, PX2, and PX3 in a plan view may be the same or may be different from each other. For example, the shapes of the lower storage electrodes LE of the second pixel PX2 and the third pixel PX3 in a plan view may be symmetrical to each other, and the shapes of the lower storage electrodes LE of the first pixel PX1 and the second pixel PX2 may be identical to each other.

The gate electrode GE2 of the switching transistor T2 may overlap the channel C2 of the switching transistor T2. The gate electrodes GE2 of the switching transistors T2 of the first to third pixels PX1, PX2, and PX3 may be connected to each other and may be integrally formed. Therefore, the same first scan signal may be applied to the gate electrodes GE2 of the switching transistors T2 of the first to third pixels PX1, PX2, and PX3. The connected gate electrodes GE2 of the switching transistors T2 may have bar shapes extending in the first direction DR1.

The gate electrode GE3 of the initialization transistor T3 may overlap the channel C3 of the initialization transistor T3. The gate electrodes GE3 of the initialization transistor T3 of the first to third pixels PX1, PX2, and PX3 may be connected to each other and may be integrally formed. The same second scan signal SS may be applied to the gate electrodes GE3 of the initialization transistors T3 of the first to third pixels PX1, PX2, and PX3. The connected gate electrodes GE3 of the initialization transistors T3 may have bar shapes extending in the first direction DR1.

After the second conductive layer is formed, a doping process may then be performed. The semiconductor layer covered by the second conductive layer may not be doped and a portion of the semiconductor layer not covered by the second conductive layer may be heavily doped and may have the same characteristic as the conductor. That is, the channel C1 of the driving transistor T1, the channel C2 of the switching transistor T2, and the channel C3 of the initialization transistor T3 covered by the second conductive layer are not doped. The first region P1 and the second region Q1 of the driving transistor T1, the first region P2 and the second region Q2 of the switching transistor T2, and the first region P3 and the second region Q3 of the initialization transistor T3 not covered by the second conductive layer are heavily doped to have the same characteristic as the conductor.

The second conductive layer may further include a sub-connection pattern CLa. The sub-connection pattern CLa may overlap the common voltage line CL and may extend in the first direction DR1. The sub-connection pattern CLa may be electrically connected to the common voltage line CL, and may reduce resistance of the common voltage line CL.

A second insulating layer IL2 may be positioned on the second conductive layer.

Referring to FIG. 4, FIG. 11, FIG. 12, FIG. 13, and FIG. 14, a third conductive layer may be positioned on the second insulating layer IL2. The third conductive layer may include a first scan line SCL, a second scan line SSL, an upper storage electrode UE, a first connection pattern CP1, a second connection pattern CP2, a third connection pattern CLb, a fourth connection pattern ILb, a fifth connection pattern DVLb, and an auxiliary common voltage line CLc.

The first scan line SCL extends in the second direction DR2. The first scan line SCL may traverse the data lines DL1, DL2, and DL3, and may overlap the data lines DL1, DL2, and DL3 at traversing portions.

The first scan line SCL may extend to a second end of the substrate SUB from a first end of the substrate SUB. A first scan signal SC may be applied to the first scan line SCL. The first scan line SCL may be connected to the gate electrode GE2 of the switching transistor T2 through contact holes C25 and C26. The gate electrode GE2 of the switching transistor T2 may accordingly receive the first scan signal SC from the first scan line SCL.

The second scan line SSL extends in the second direction DR2. The second scan line SSL may traverse the data lines DL1, DL2, and DL3, and may overlap the data lines DL1, DL2, and DL3 at the traversing portions.

The second scan line SSL may extend to a second end of the substrate SUB from a first end of the substrate SUB. The second scan signal SS may be applied to the second scan line SSL. The second scan line SSL may be connected to the gate electrode GE3 of the initialization transistor T3 through a contact hole C29. The gate electrode GE3 of the initialization transistor T3 may accordingly receive the second scan signal SS from the second scan line SSL.

The upper storage electrode UE may overlap the lower storage electrode LE. The lower storage electrode LE and the upper storage electrode UE may overlap each other with the second insulating layer IL2 disposed therebetween to thus form a capacitor Cst. The lower storage electrode LE may overlap the first layer BML with the first insulating layer IL1 disposed therebetween to thus form a capacitor Cst. The first layer BML may function as a storage electrode. Because the first capacitor formed between the lower storage electrode LE and the upper electrode UE, and the second capacitor formed between the lower storage electrode LE and the first layer BML are parallel capacitances, total capacitance of the capacitor may be increased in a narrow area.

The upper storage electrode UE may overlap the second region Q1 of the driving transistor T1. The second insulating layer IL2 may include a contact hole C12 overlapping the upper storage electrode UE and the second region Q1 of the driving transistor T1. The upper storage electrode UE may be connected to the second region Q1 of the driving transistor T1 through the contact hole C12.

The upper storage electrode UE may overlap the sixth connection pattern CP6. At least part of the sixth connection pattern CP6 may overlap the second region Q3 of the initialization transistor T3. The sixth connection pattern CP6 may be connected through a contact hole C17 overlapping the upper storage electrode UE and a contact hole C18 overlapping the second region Q3 of the initialization transistor T3. The upper storage electrode UE may be electrically connected to the second region Q3 of the initialization transistor T3 through the sixth connection pattern CP6.

The respective first to third pixels PX1, PX2, and PX3 include an upper storage electrode UE, a lower storage electrode LE, and a first layer BML. The upper storage electrodes UE, the lower storage electrodes LE, and the first layers BML of the first to third pixels PX1, PX2, and PX3 may be positioned between the driving voltage line DVL and the first data line DL1 in a plan view. The upper storage electrodes UE of the first to third pixels PX1, PX2, and PX3 may be positioned adjacent to each other in the first direction DR1. In a plan view, the upper storage electrode UE of the second pixel PX2 may be positioned on the lower side of the upper storage electrode UE of the first pixel PX1, and the upper storage electrode UE of the third pixel PX3 may be positioned on the lower side of the upper storage electrode UE of the second pixel PX2. The lower storage electrodes LE of the first to third pixels PX1, PX2, and PX3 may be positioned adjacent to each other in the first direction DR1. In a plan view, the lower storage electrode LE of the second pixel PX2 may be positioned on the lower side of the lower storage electrode LE of the first pixel PX1, and the lower storage electrode LE of the third pixel PX3 may be positioned on the lower side of the lower storage electrode LE of the second pixel PX2.

The shape of the upper storage electrode UE in a plan view may have a polygonal shape. The shapes of the upper storage electrodes UE of the first to third pixels PX1, PX2, and PX3 in a plan view may be the same as or may be different from each other. For example, the shapes of the upper storage electrodes UE of the first pixel PX1 and the second pixel PX2 in a plan view may be the same, and the shapes of the upper storage electrodes UE of the second pixel PX2 and the third pixel PX3 in a plan view may be symmetrical to each other.

The respective pixels PX1, PX2, and PX3 may include a first connection pattern CP1. The first connection patterns CP1 of the respective pixels PX1, PX2, and PX3 may overlap at least one of the data lines DL1, DL2, and DL3. The second insulating layer IL2 may include contact holes C21 and C22 overlapping the data lines DL1, DL2, and DL3, and a first connection pattern CP1. The first connection pattern CP1 may be connected to the data lines DL1, DL2, and DL3 through the contact hole C22, and may be connected to the first region P2 of the switching transistor T2 through the contact hole C21. The first connection pattern CP1 may connect one of the data lines DL1, DL2, and DL3 and the first region P2 of the switching transistor T2. The first connection pattern CP1 may connect the first data line DL1 and the first region P2 of the switching transistor T2 on the first pixel PX1. The first connection pattern CP1 may connect the second data line DL2 and the first region P2 of the switching transistor T2 on the second pixel PX2. The first connection pattern CP1 may connect the third data line DL3 and the first region P2 of the switching transistor T2 on the third pixel PX3.

The respective pixels PX1, PX2, and PX3 may include a second connection pattern CP2. The second connection patterns CP2 of the respective pixels PX1, PX2, and PX3 may overlap the second region Q2 of the switching transistor T2. The second connection pattern CP2 may be connected to the second region Q2 of the switching transistor T2 through the contact hole C24. The second connection patterns CP2 of the respective pixels PX1, PX2, and PX3 may overlap the lower storage electrode LE. The second connection pattern CP2 may be connected to the lower storage electrode LE through the contact hole C23. Therefore, the second connection pattern CP2 may connect the second region Q2 of the switching transistor T2 and the lower storage electrode LE on the respective pixels PX1, PX2, and PX3.

The third connection pattern CLb may overlap the common voltage line CL. The third connection pattern CLb may have a bar shape extending in the first direction DR1. The common voltage line CL may extend to a second end of the substrate SUB from a first end thereof in a plan view. The third connection pattern CLb may be connected to the common voltage line CL and the sub-connection pattern CLa through contact holes C41 and C42, and may reduce resistance of the common voltage line CL.

The fourth connection pattern ILb may overlap the initialization voltage line IL. The fourth connection pattern ILb may be connected to the initialization voltage line IL through a contact hole C34. The fourth connection pattern ILb may reduce resistance of the initialization voltage line IL. The fourth connection pattern ILb may have a bar shape extending in the first direction DR1. The fourth connection pattern ILb may overlap the first region P3 of the third transistor T3. The fourth connection pattern ILb may be connected to the first region P3 of the third transistor T3 through a contact hole C31. The fourth connection pattern ILb may electrically connect the initialization voltage line IL and the first region P3 of the third transistor T3. The first region P3 of the third transistor T3 may receive the initialization voltage INIT.

The fifth connection pattern DVLb may overlap the driving voltage line DVL. The fifth connection pattern DVLb may be connected to the driving voltage line DVL through a contact hole C13. The fifth connection pattern DVLb may reduce resistance of the driving voltage line DVL. The fifth connection pattern DVLb may be an isolated pattern formed corresponding to each of three pixels PX1, PX2, and PX3. The fifth connection pattern DVLb may be electrically connected to the first region P1 of the first transistor T1 through a contact hole C11. The fifth connection pattern DVLb may connect the driving voltage line DVL and the first region P1 of the first transistor T1.

The auxiliary common voltage line CLc may extend in the second direction DR2. The auxiliary common voltage line CLc may traverse the common voltage line CL, and may overlap the common voltage line CL at their traversing portion. The auxiliary common voltage line CLc may be connected to the common voltage line CL through the contact hole C41. The common voltage ELVSS may be applied to the auxiliary common voltage line CLc. The auxiliary common voltage line CLc may reduce resistance of the common voltage line CL.

The third insulating layer IL3 may be positioned on the third conductive layer as described with reference to FIG. 4.

At least one of the first conductive layer, the second conductive layer, and the third conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. The first conductive layer, the second conductive layer, and the third conductive layer may be respectively formed to be a single layer or a multilayer. For example, they may have a multilayered structure including a lower layer including titanium and an upper layer including copper.

At least one of the buffer layer BF, the first insulating layer IL1, the second insulating layer IL2, and the third insulating layer IL3 may include an inorganic insulating material such as a silicon nitride (SiNx), a silicon oxide (SiOx), or a silicon oxynitride ($SiO_xN_y$) and/or an organic insulating material such as a polyimide, an acryl-based polymer, or a siloxane-based polymer.

Figure 15:
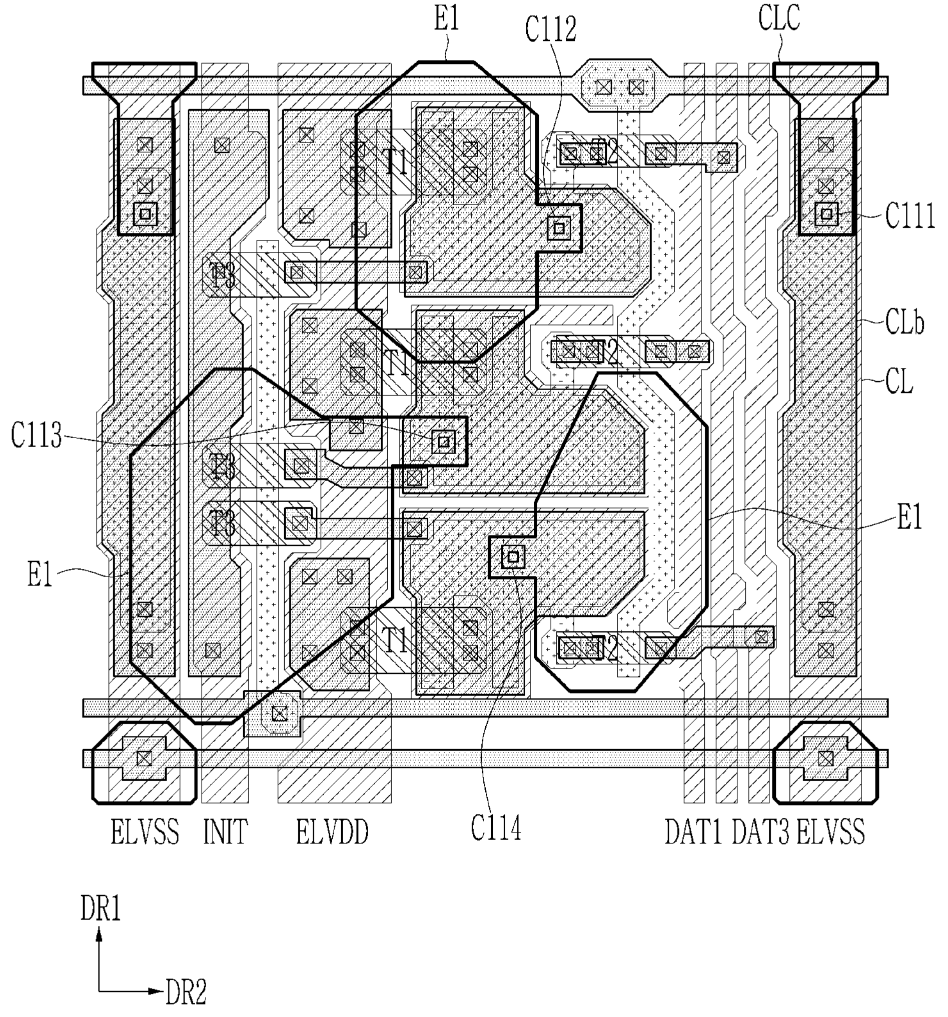

As shown in FIG. 4 and FIG. 15, a fourth conductive layer including a first electrode E1 and a common voltage transmitting line CLC may be positioned on the third insulating layer IL3.

The common voltage transmitting line CLC may be connected to the third connection pattern CLb through the contact hole C111, and may be electrically connected to the common voltage line CL. The first electrode E1 may be electrically connected to the first transistor T1 through contact holes C112, C113, and C114 overlapping the upper storage electrode UE.

The first electrode E1 of the first pixel PX may overlap some of the transistors T1, T2, and T3 of the first pixel PX1, and some of the transistors T1, T2, and T3 of other pixels.

The transistors T1, T2, and T3 of the respective pixels PX1, PX2, and PX3 may/may not overlap the first electrode E1. That is, the respective first electrodes E1 may overlap other pixels.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:

a substrate including a signal wire area and a transistor area;

a first layer disposed in the transistor area;

a signal wire disposed in the signal wire area and including a first sub-data line and a second sub-data line disposed on the first sub-data line;

a transistor disposed on the first layer and including a semiconductor layer;

a first electrode electrically connected to the transistor; and an emission layer and a second electrode disposed on the first electrode, wherein the first layer and the signal wire are disposed on a same layer on the substrate, and the first layer and the signal wire have different thicknesses, wherein side edges of the first sub-data line and the second sub-data line are substantially aligned, and wherein the display device further comprises an insulating layer on which the semiconductor layer is disposed, and a surface of a first portion of the insulating layer, which directly contacts an upper surface of the second sub-data line, is disposed farther from the substrate than a surface of a second portion of the insulating layer, which directly contacts an upper surface of the first layer.

2. The display device of claim 1, wherein the first layer is thinner than the signal wire.

3. The display device of claim 1, wherein the thickness of the first layer is equal to or less than about 500 angstroms and the thickness of the signal wire is from about 3000 to about 10000 angstroms.

4. The display device of claim 1, wherein the signal wire is a data line.

5. The display device of claim 4, wherein the first layer and the first sub-data line include a same material and are formed at the same time.

6. The display device of claim 4, wherein the first layer and the first sub-data line include titanium.

7. The display device of claim 4, wherein the second sub-data line includes copper.

8. The display device of claim 1, wherein the insulating layer is a buffer layer disposed on the signal wire and the first layer, and the buffer layer includes a first step caused by the first layer and a second step caused by the signal wire.

9. The display device of claim 8, wherein the first step is lower than the second step.

10. The display device of claim 8, wherein the buffer layer includes an inorganic material.

11. An electronic apparatus comprising:

a display panel including a display area and a non-display area;

a pad area disposed on the non-display area and including a plurality of terminals; and a controller connected to the pad area and transmitting image signals to the display panel, wherein the display panel includes:

a substrate including a signal wire area and a transistor area;

a first layer disposed in the transistor area;

a signal wire disposed in the signal wire area and including a first sub-data line and a second sub-data line disposed on the first sub-data line;

a transistor disposed on the first layer and including a semiconductor layer;

a first electrode electrically connected to the transistor; and an emission layer and a second electrode disposed on the first electrode, wherein the first layer and the signal wire are disposed on a same layer on the substrate, and the first layer and the signal wire have different thicknesses, wherein the first sub-data line and the second sub-data line have aligned side surfaces, and wherein the display panel further comprises an insulating layer on which the semiconductor layer is disposed, and a surface of a first portion of the insulating layer, which directly contacts an upper surface of the second sub-data line, is disposed farther from the substrate than a surface of a second portion of the insulating layer, which directly contacts an upper surface of the first layer.

12. The electronic apparatus of claim 11, wherein the first layer and the first sub-data line include a same material and are formed at the same time.

* * * * *